(12) United States Patent
Chen et al.

(10) Patent No.: US 12,148,686 B2
(45) Date of Patent: *Nov. 19, 2024

(54) PACKAGE DEVICE AND MANUFACTURING METHOD THEREOF

(71) Applicant: InnoLux Corporation, Miao-Li County (TW)

(72) Inventors: Yeong-E Chen, Miao-Li County (TW); Cheng-En Cheng, Miao-Li County (TW); Yu-Ting Liu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 383 days.

This patent is subject to a terminal disclaimer.

(21) Appl. No.: 17/572,657

(22) Filed: Jan. 11, 2022

(65) Prior Publication Data

US 2022/0157703 A1    May 19, 2022

Related U.S. Application Data

(63) Continuation-in-part of application No. 17/114,507, filed on Dec. 8, 2020, now Pat. No. 11,398,430.

(30) Foreign Application Priority Data

Nov. 9, 2020  (CN) .......................... 202011239888.6
Nov. 9, 2021  (CN) .......................... 202111320643.0

(51) Int. Cl.
  *H01L 23/498*    (2006.01)
  *H01L 21/48*     (2006.01)
(52) U.S. Cl.
  CPC .... *H01L 23/49822* (2013.01); *H01L 21/4857* (2013.01); *H01L 23/49838* (2013.01)
(58) Field of Classification Search
  CPC ............ H01L 23/5384; H01L 23/5386; H01L 21/76802; H01L 21/76816; H01L 22/32; H01L 22/34
  See application file for complete search history.

(56) References Cited

U.S. PATENT DOCUMENTS

| 11,398,430 B2* | 7/2022 | Chen | ...................... H01L 22/32 |
| 2018/0190579 A1* | 7/2018 | Chou | ................ H01L 23/49838 |
| 2020/0365514 A1* | 11/2020 | Yang | ................ H01L 21/76805 |
| 2021/0202268 A1* | 7/2021 | Lin | ..................... H01L 21/4853 |

* cited by examiner

*Primary Examiner* — Bac H Au
(74) *Attorney, Agent, or Firm* — Winston Hsu

(57) ABSTRACT

The present disclosure provides a package device and a manufacturing method thereof. The package device includes a redistribution layer which includes a first dielectric layer, a conductive layer and a second dielectric layer. The conductive layer is disposed between the first dielectric layer and the second dielectric layer. The redistribution layer has a test pattern that includes a first conductive pattern, and the first conductive pattern is formed of the conductive layer.

14 Claims, 10 Drawing Sheets

PACKAGE DEVICE AND MANUFACTURING METHOD THEREOF

CROSS REFERENCE TO RELATED APPLICATIONS

This application is a continuation-in-part of U.S. patent application Ser. No. 17/114,507, filed Dec. 8, 2020, which claims the benefit of Chinese Patent Application Ser. No. 202011239888.6, filed Nov. 9, 2020, and claims benefit of Chinese Patent Application Ser. No. 202111320643.0, filed Nov. 9, 2021, the entire contents of which are incorporated herein by reference.

BACKGROUND OF THE DISCLOSURE

1. Field of the Disclosure

The present disclosure relates to a package device and a manufacturing method thereof, and more particularly to a package device having a test pattern and a manufacturing method thereof.

2. Description of the Prior Art

In packaging technology, multiple packaging devices may be produced by performing a redistribution layer process on a substrate. However, the stacking thickness of the redistribution structure (such as a dielectric layer) in different positions of the substrate may be different, and this difference may be about several micrometers. Therefore, when the through holes are to be formed in different portions of the dielectric layer in different positions, it is difficult to ensure whether the through holes penetrate through the dielectric layer in different positions in conventional technology. Also, currently, there is no way to inline inspecting processes of the redistribution layer, so that process quality of the patterned through holes cannot be determined in real time.

SUMMARY OF THE DISCLOSURE

According to an embodiment of the present disclosure, a package device is provided. The package device includes a redistribution layer. The redistribution layer includes a first dielectric layer, a conductive layer and a second dielectric layer, and the conductive layer is disposed between the first dielectric layer and the second dielectric layer. The redistribution layer has a test pattern including a first conductive pattern, and the first conductive pattern is formed of the conductive layer.

According to another embodiment of the present disclosure, a manufacturing method of a package device is provided. The manufacturing method includes providing a carrier; and forming a redistribution layer on the carrier. The redistribution layer includes a first dielectric layer, a conductive layer and a second dielectric layer, and the conductive layer is disposed between the first dielectric layer and the second dielectric layer. The redistribution layer has a test pattern including a first conductive pattern, and the first conductive pattern is formed of the conductive layer.

These and other objectives of the present disclosure will no doubt become obvious to those of ordinary skill in the art after reading the following detailed description of the embodiment that is illustrated in the various figures and drawings.

DETAILED DESCRIPTION

Figure 1:
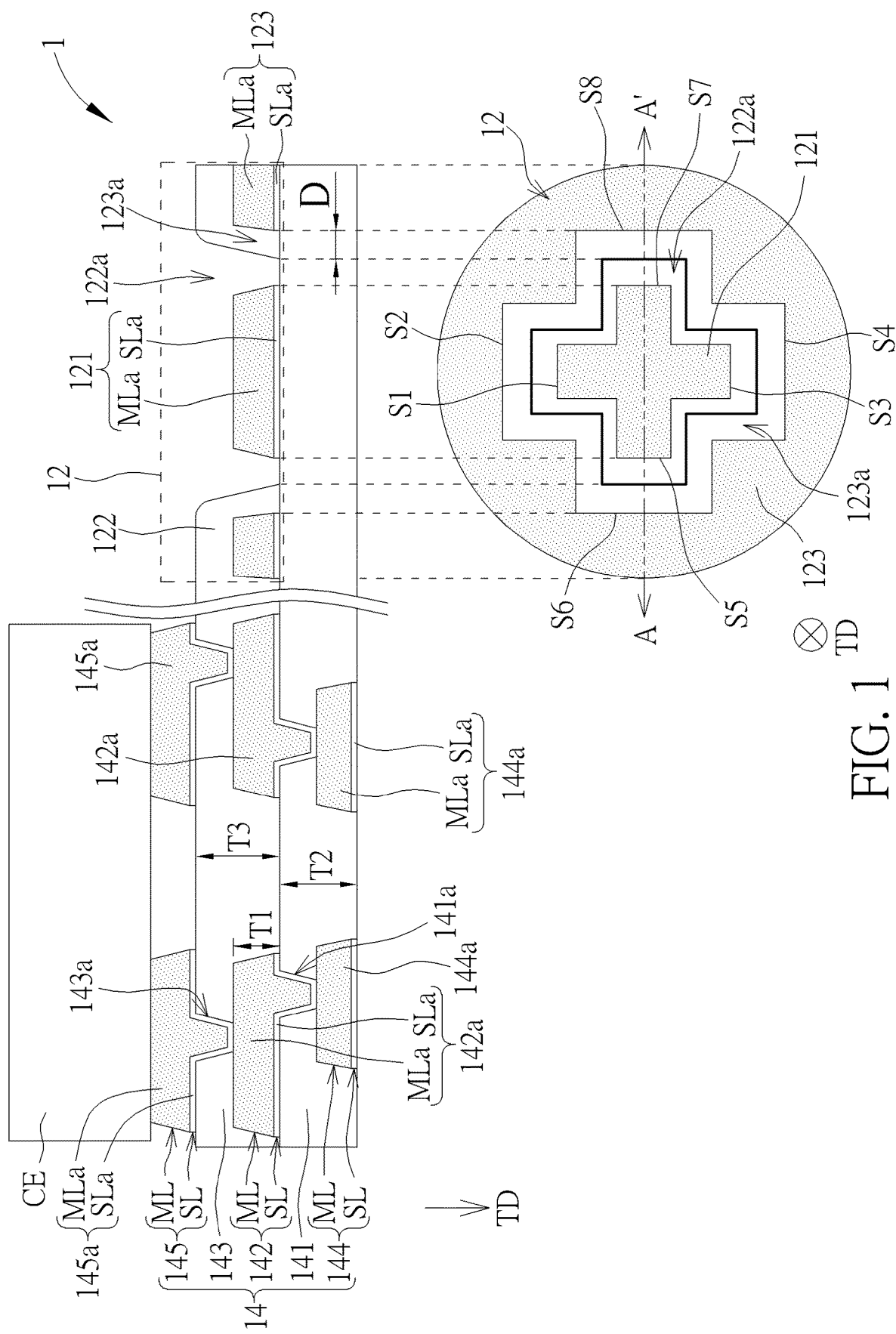
FIG. 1 schematically illustrates a package device according to an embodiment of the present disclosure.

Hereinafter, package devices of embodiments of the present disclosure are detailed in the following description. It should be understood that many different embodiments provided below are implemented to different aspects. The following specific components and arrangements describe some embodiments for simplicity and clarity only. Of course, these are only for example and not for limitation. In addition, similar components may be labeled with similar and/or corresponding reference numerals indifferent embodiments for clarity of description. However, these similar reference numbers only describe some embodiments simply and clearly, and do not mean that there is any relationship between different embodiments and/or structures discussed.

When a first layer is located on or above a second layer, the first layer may be in direct contact with the second layer. Alternatively, one or more other layers may be spaced between them, and in such case, the first layer may not be in direct contact with the second layer.

The contents of the present disclosure will be described in detail with reference to specific embodiments and drawings. In order to make the contents clearer and easier to understand, the following drawings may be simplified schematic diagrams, and components therein may not be drawn to scale. The numbers and sizes of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . ". It should also be understood that when a component is said to be "coupled" to another component (or a variant thereof), it may be directly connected to another component or indirectly connected (e.g., electrically connected) to another component through one or more components.

When ordinal numbers, such as "first" and "second", used in the specification and claims are used to modify components in the claims, they do not mean and represent that the claimed components have any previous ordinal numbers, nor do they represent the order of a claimed component and another claimed component, or the order of manufacturing methods. These ordinal numbers are just used to distinguish a claimed component with a certain name from another claimed component with the same name.

When a component (e.g., film or region) is called "on another component", it may be directly on the another component, or there may be other components in between. On the other hand, when a component is called "directly on another component", there is no component between them. In addition, when a component is called "on another component", there is an upper and lower relationship between the two components in a top view direction, and this component may be above or below the other component, and this upper and lower relationship depends on the orientation of the device.

In this document, the terms "about", "substantially" and "approximately" usually mean within 10%, 5%, 3%, 2%, 1% or 0.5% of a given value or range. The quantity given here is about the quantity, that is, without specifying "about", "substantially" and "approximately", the meanings of "about", "substantially" and "approximately" may still be implied. In addition, the term "range from a first value to a second value" means that the range includes the first value, the second value and other values between them.

It should be understood that according to the following embodiments, features of different embodiments may be replaced, recombined or mixed to constitute other embodiments without departing from the spirit of the present disclosure. As long as the features of the embodiments do not violate the inventive spirit or conflict with each other, they can be mixed and used at will.

In the present disclosure, the thicknesses, lengths and widths may be measured by optical microscope, in which the thicknesses may be measured from cross-sectional image obtained by electron microscope, but the present disclosure is not limited to this. In addition, any two values or directions used for comparison may have certain errors. If a first value is equal to a second value, it implies that there may be about 10% error between the first value and the second value; if a first direction is perpendicular to a second direction, an angle between the first direction and the second direction may range from 80 degrees to 100 degrees; and if the first direction is parallel to the second direction, the angle between the first direction and the second direction may range from 0 to 10 degrees.

Unless otherwise defined, all terms used herein (including technical and scientific terms) have the same meanings as those commonly understood by those skilled in the art to which the present disclosure belongs. It can be understood that these terms, such as those defined in commonly used dictionaries, should be interpreted as meanings consistent with the background or context of related technologies and the present disclosure, and should not be interpreted in an idealized or overly formal way, unless it is specifically defined in the embodiments of the present disclosure.

FIG. 1 schematically illustrates a package device according to an embodiment of the present disclosure. An upper part in FIG. 1 is a schematic cross-sectional view of the package device 1, a lower part is a schematic top view of a test pattern of the package device 1. In FIG. 1, a cross-sectional structure in right portion of the upper part is a schematic cross-sectional view taken along a line A-A' of the lower part. For clarity, FIG. 1 shows the cross-sectional structure of a part of the package device 1, but the present disclosure is not limited thereto. As shown in FIG. 1, the package device 1 may include a redistribution layer 14, and the redistribution layer 14 may have at least one test pattern 12. In processes of manufacturing the redistribution layer 14, the test pattern 12 may be used to inspect quality of a process (including the patterning process) of a layer of the redistribution layer 14 formed simultaneously with the test pattern 12 in real time, but the present disclosure is not limited thereto. In some embodiments, the package device 1 may include an electronic component CE (e.g., a semiconductor chip) disposed on the redistribution layer 14. For example, the electronic component CE includes a chip, a passive component, or other suitable components. In some embodiments, the redistribution layer 14 may include a fan-out circuit structure, such as a redistribution circuit used for forming an integrated circuit (IC) with high density, formed on a wafer.

In the embodiment of FIG. 1, the redistribution layer 14 may include a first dielectric layer 141, a conductive layer 142 and a second dielectric layer 143, and the conductive layer 142 may be disposed between the first dielectric layer 141 and the second dielectric layer 143. The test pattern 12 may include a first conductive pattern 121 and a dielectric pattern 122 corresponding to the first conductive pattern 121. The first conductive pattern 121 may be formed of the conductive layer 142, and the dielectric pattern 122 may be formed of the transparent second dielectric layer 143. For example, the conductive layer 142 may include a metal material, such as copper (Cu), titanium (Ti), aluminum (Al), molybdenum (Mo), nickel (Ni), other metals, or any combination thereof, but the present disclosure is not limited thereto. A thickness T1 of the conductive layer 142 may range from 4 μm to 5 μm (4 μm≤thickness T1≤5 μm), but is not limited thereto. The first dielectric layer 141 and the second dielectric layer 143 may include, for example, photosensitive polyimide or other suitable dielectric materials, but not limited thereto. A thickness T2 of the first dielectric layer 141 and a thickness T3 of the second dielectric layer 143 may range from 4 μm to 7 μm (4 μm≤thickness T2≤7 μm; 4 μm≤thickness T3≤7 μm), but is not limited thereto. The thickness T1 of the conductive layer 142 mentioned herein may refer to a maximum thickness of a portion of the conductive layer 142 that does not extend into a through hole (for example, a through hole 141a) in a top view direction TD. The thickness T2 of the first dielectric layer 141 or the thickness T3 of the second dielectric layer 143 mentioned herein may refer to a maximum thickness of one of the dielectric layers that does not overlap the conductive layer covered by this dielectric layer in the top view direction TD, as shown in FIG. 1, but the present disclosure is not limited to this.

In the embodiment of FIG. 1, the dielectric pattern 122 may have at least one through hole 122a exposing the first conductive pattern 121. In other words, in the top view direction TD of the package device 1, the first conductive pattern 121 may be located in the through hole 122a, the first conductive pattern 121 is not completely covered by the second dielectric layer 143. In some embodiments, in the top view direction TD of the package device 1, at least one side of the first conductive pattern 121 may be substantially aligned to at least one side of the through hole 122a. In one embodiment, in an optical microscope image, an image color of a portion of the first conductive pattern 121 overlapping the second dielectric layer 143 is different from an image color of another portion of the first conductive pattern 121 that does not overlap the second dielectric layer 143, so that a relative relationship between the first conductive pattern 121 and the dielectric pattern 122 may be inspected by capturing the image of the test pattern 12, thereby determining whether the patterning processes of the layers of the redistribution layer 14 meet standards. In some embodiments, methods to determine whether the patterning processes meet the standards may for example be performed by measuring a distance between a side of the first conductive pattern 121 and a side of the through hole 122a, inspecting whether the first conductive pattern 121 is completely exposed by the through hole 122a or whether the first conductive pattern 121 overlaps the through hole 122a of the dielectric pattern 122 in the top view direction TD of the package device 1, or inspecting an overlapping area of the first conductive pattern 121 and the through hole 122a of the dielectric pattern 122, but not limited thereto. In the present disclosure, the top view direction TD may be, for example, a normal direction of the substrate 16.

As shown in the lower part of FIG. 1, a top view shape of the first conductive pattern 121 of the test pattern 12 may substantially correspond to or be complementary to a top view shape of the through hole 122a. For example, both the top view shape of the first conductive pattern 121 and the top view shape of the through hole 122a may be cross-shaped, star-shaped, polygonal, arc-edge-shaped, other shapes or any combination thereof, but not limited to this. In some embodiments, by means of measuring whether the top view shape of the first conductive pattern 121 is completely exposed, quality of the patterning process of the second dielectric layer 143, such as the process for forming the through hole of the second dielectric layer 143 or the alignment of photomask, may be determined. In some embodiments, the top view shape of the first conductive pattern 121 may be the same or different from the top view shape of the through hole 122a.

In the embodiment of FIG. 1, the test pattern 12 may further include a second conductive pattern 123 adjacent to the first conductive pattern 121. The second conductive pattern 123 is formed of the conductive layer 142. In other words, the first conductive pattern 121 and the second conductive pattern 123 may be formed of the same conductive layer 142. The second conductive pattern 123 may have an opening 123a, and in the top view direction TD, the first conductive pattern 121 and the through hole 122a are disposed in the opening 123a. In the embodiment of FIG. 1, a top view shape of the opening 123a may be the same as or different from the top view shape of the through hole 122a and/or the top view shape of the first conductive pattern 121. In some embodiments, the quality of the patterning process may be determined by measuring a distance between a side of the first conductive pattern 121 and a side of the opening 123a of the second conductive pattern 123 corresponding to or adjacent to the side of the first conductive pattern 121. For example, by measuring the distance between the side S1 of the first conductive pattern 121 and the side S2 of the opening 123a, the distance between the side S3 of the first conductive pattern 121 and the side S4 of the opening 123a and/or the distance between the side S5 of the first conductive pattern 121 and the side S6 of the opening 123a, and the distance between the side S7 of the first conductive pattern 121 and the side S8 of the opening 123a, the quality of the patterning process may be determined, but not limited thereto. In some embodiments, the quality of the patterning process may be determined by measuring the distance (not labeled) between the side of the first conductive pattern 121 (or the side of the opening 123a) and aside of the through hole 122a corresponding to or adjacent to the side of the first conductive pattern 121 (or the side of the opening 123a). In some embodiments, in the top view direction TD of the package device 1, at least one side of the second conductive pattern 123 may be substantially aligned to at least one side of the through hole 122a. That is, a distance D between the side of the second conductive pattern 123 and the side of the through hole 122a may be less than or equal to 1 micrometer (μm) while being measured along a direction perpendicular to the top view direction TD, so as to improve alignment quality.

By means of the determination of the test pattern 12, whether other components formed at the same time as the test pattern 12 meet the standards or criteria may be inspected. For example, as shown in FIG. 1, the redistribution layer 14 further includes at least one trace 142a that is formed of the conductive layer 142, and the second dielectric layer 143 may have at least one through hole 143a corresponding to the trace 142a in the top view direction TD of the package device 1, the conductive layer (such as the conductive layer 145) formed on the second dielectric layer 143 may be electrically connected to the trace 142a through the through hole 143a. For example, the trace 142a may be electrically connected to the electronic component CE disposed on the redistribution layer 14 through other conductive layers or conductive components.

It should be noted that by means of inspecting the relative relationship between the first conductive pattern 121 and the through hole 122a, it may be determined whether the relative relationship between the through hole 143a formed at the same time as the through hole 122a and the trace 142a formed at the same time as the first conductive pattern 121 meets the standard or criterion, the inspection may be achieved in real time after the second dielectric layer 143 is formed. For example, whether the through holes 143a in different positions of the second dielectric layer 143 penetrate through the second dielectric layer 143 to expose parts of the trace 142a may be inspected in real time. In some embodiments, the trace 142a may be electrically insulated from the test pattern 12 (including the first conductive pattern 121 and/or the second conductive pattern 123), for example.

The redistribution layer 14 may include other layers. In the embodiment shown in FIG. 1, the redistribution layer 14 may include a conductive layer 144 disposed under the first dielectric layer 141 and a conductive layer 145 disposed on the second dielectric layer 143. For example, the conductive layer 144 may include at least one lower pad 144a located on a lower surface of the redistribution layer 14. The first dielectric layer 141 may have at least one through hole 141a, the trace 142a may be electrically connected to the lower pad 144a through the through hole 141a. The conductive layer 145 may include at least one upper pad 145a located on an upper surface of the redistribution layer 14 and used for electrically connecting the electronic component CE or other suitable components. The upper pad 145a may be electrically connected to the trace 142a through the through hole 143a, the upper pad 145a may be electrically connected to the lower pad 144a through the trace 142a, but is not limited thereto. In some embodiments, a thickness of the conductive layer 144 and a thickness of the conductive layer 145 may be similar to or the same as that of the conductive layer 142, but not limited thereto. In some embodiments (not shown), the redistribution layer 14 may include other test patterns formed of other conductive layers and other dielectric layers and used to inspect quality and alignment accuracy of the patterning processes of the corresponding conductive layers and dielectric layers in real time. For example, in some embodiments (not shown), at least one test pattern may include the conductive layer 144 and/or the first dielectric layer 141, the quality of the patterning process of the conductive layer 144 and the first dielectric layer 141 may be inspected in real time. In some embodiments, the redistribution layer 14 may further include other conductive layers and other dielectric layers between the second dielectric layer 143 and the conductive layer 145 including the upper pad 145a. In some embodiments, the redistribution layer 14 may further include other conductive layers and other dielectric layers between the first dielectric layer 141 and the conductive layer 144 including the lower pad 144a, but is not limited thereto. In some embodiments, the test patterns formed of different conductive layers may overlap each other or may not overlap each other in the top view direction TD. In some embodiments, the number of the test pattern 12 corresponding to a single conductive layer may not be limited to one as shown in FIG. 1, and may be plural.

As shown in FIG. 1, the conductive layer 142, the conductive layer 144 and/or the conductive layer 145 may be a single-layer structure or a multilayered structure. For instance, the multilayered structure may include a seed layer SL and a metal layer ML stacked sequentially, but is not limited thereto. In such case, the first conductive pattern 121, the second conductive pattern 123, the lower pad 144a, the trace 142a and/or the upper pad 145a may respectively include a seed block MLa and a metal block SLa, but are not limited thereto. For example, the conductive layer 142, the conductive layer 144 and the conductive layer 145 may include copper (Cu), titanium (Ti), aluminum (Al), molybdenum (Mo), nickel (Ni), other materials or any combination of the above materials, but are not limited thereto.

Figure 2:
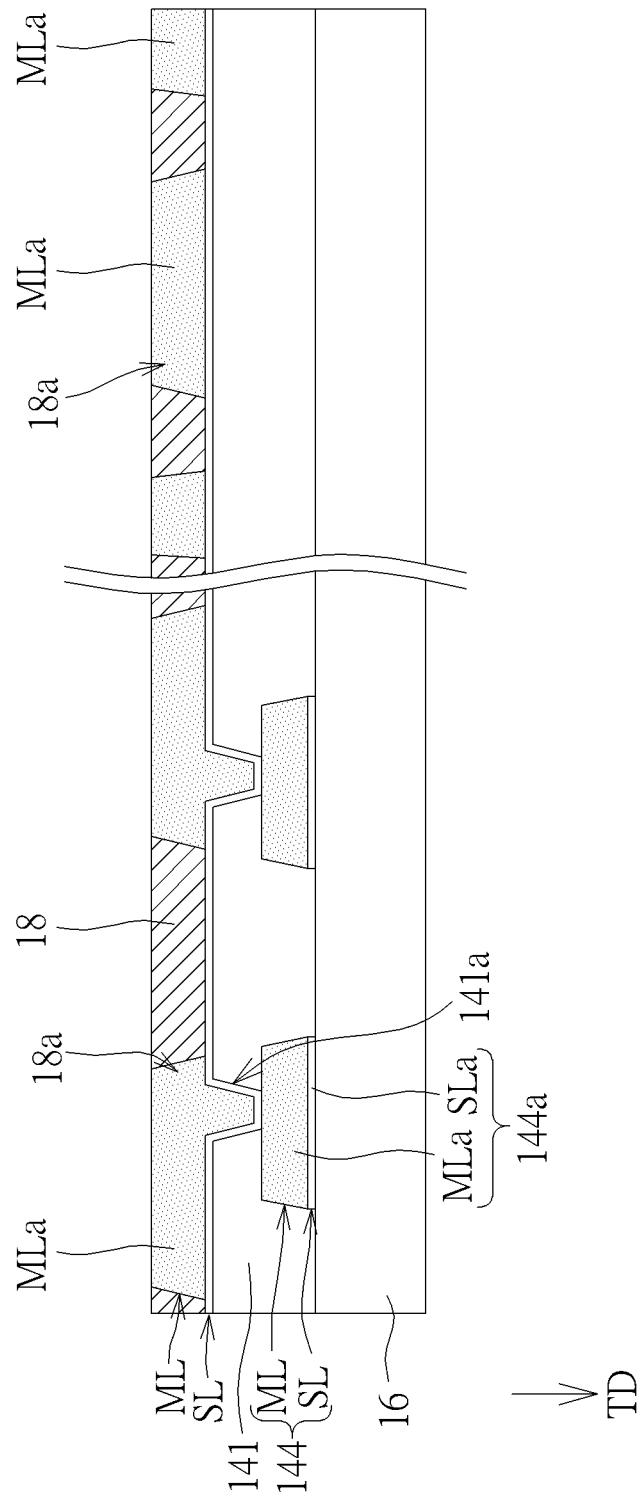
FIG. 2 and FIG. 3 respectively illustrate structures in different steps of the manufacturing method of the package device according to an embodiment of the present disclosure.
Figure 3:
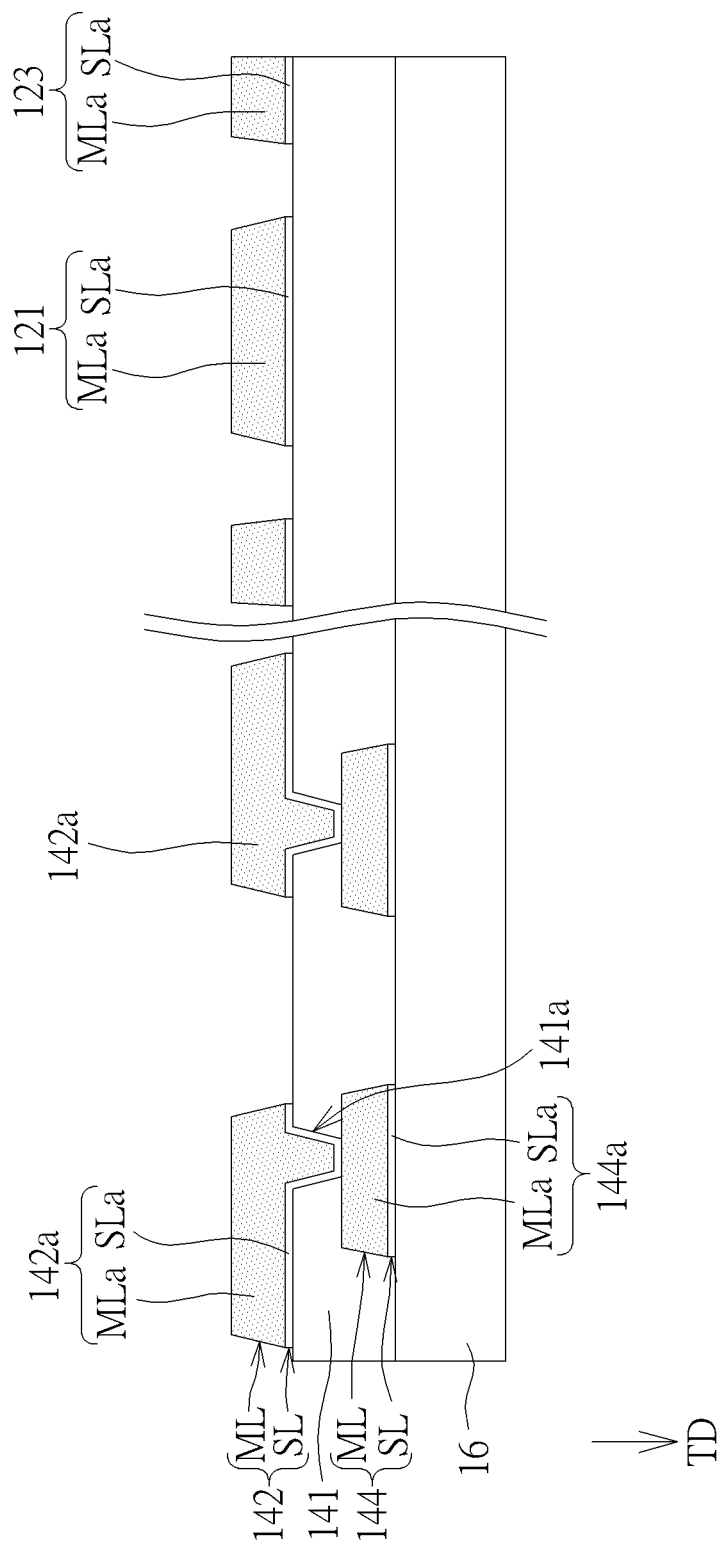

The manufacturing method of the package device of this embodiment is further described below. Please refer to FIG. 2 and FIG. 3 as well as FIG. 1. FIG. 2 and FIG. 3 respectively illustrate structures in different steps of the manufacturing method of the package device according to an embodiment of the present disclosure. As shown in FIG. 2, a carrier 16 is provided first, and then, the conductive layer 144 including the lower pad 144a is formed on the carrier 16. The carrier 16 may include, for example, glass, wafer, an electronic component, an electronic component surrounded by an encapsulation structure, or other substrates suitable for supporting the redistribution layer 14, in which the encapsulation structure may include polycarbonate (PC), polyimide (PI), polyethylene terephthalate (PET), resin, epoxy resin, organosilicon compound, or combinations thereof, but not limited thereto. Next, the first dielectric layer 141 is formed on the conductive layer 144 and the carrier 16, and then, the through hole 141a is formed in the first dielectric layer 141 to expose a part of the lower pad 144a. The method for forming the through hole 141a may include an exposure process and a development process, but is not limited to this. After that, the seed layer SL is formed on the first dielectric layer 141, in which the seed layer SL may further extend into the through hole 141a. Thereafter, at least one photoresist pattern 18 is formed on the seed layer SL through an exposure process and a development process. A plurality of openings 18a are formed between a plurality of photoresist patterns 18, and the openings 18a may respectively expose a part of the seed layer SL. Then, the metal layer ML is formed in the openings 18a, such that the metal layer ML may include a plurality of metal blocks MLa respectively disposed in the corresponding openings 18a. In some embodiments, the method for forming the metal layer ML may include an electroplating process, an electroless plating process, a physical vapor deposition process, or other suitable processes. As shown in FIG. 3, the photoresist patterns 18 are removed after the metal layer ML is formed for exposing a part of the seed layer SL under the photoresist patterns 18. Then, a part of the seed layer SL that is not covered by the metal layer ML is removed by an etching process, such that the seed layer SL may be divided into a plurality of seed blocks SLa, and the seed blocks SLa and the corresponding metal blocks MLa that overlap each other may form the trace 142a, the first conductive pattern 121 and/or the second conductive pattern 123 described above. That is, the trace 142a, the first conductive pattern 121 and/or the second conductive pattern 123 may be formed of the conductive layer 142 (including the seed layer SL and/or the metal layer ML).

As shown in FIG. 1, after the conductive layer 142 (including the trace 142a, the first conductive pattern 121 and/or the second conductive pattern 123) are formed, the second dielectric layer 143 may be formed on the conductive layer 142 (including the trace 142a, the first conductive pattern 121 and/or the second conductive pattern 123) and the first dielectric layer 141, and then, the through hole 122a (corresponding to the first conductive pattern 121) and the through hole (corresponding to the trace 142a) are formed in the second dielectric layer 143. The method for forming the through hole 122a and the through hole 143a may be the same or similar to that for forming the through hole 141a, and therefore are not described redundantly. The through hole 143a (corresponding to the trace 142a) may expose a part of the trace 142a. The through hole 122a (corresponding to the first conductive pattern 121) may expose the first conductive pattern 121. The test pattern 12 may include the first conductive pattern 121, the second conductive pattern 123 and/or the through hole 122a of the second dielectric layer 143. After the test pattern 12 is formed, an inspection step may be performed to obtain a top view image of the test pattern 12. Since the first conductive pattern 121, the second conductive pattern 123, and the trace 142a may be formed at the same time, and the through hole 122a and the through hole 143a may be formed at the same time, the quality of the patterning process for forming the trace 142a and the through hole 143a may be determined by the quality inspection of the test pattern 12. It should be noted that the real-time inspection of the conductive layer 142 and/or the second dielectric layer 143 may improve the patterning process in real time, thereby increasing the yield rate of the process.

As shown in FIG. 1, after the conductive layer 142 and the second dielectric layer 143 are inspected, the conductive layer 145 may be formed on the second dielectric layer 143, thereby forming the redistribution layer 14 on the carrier 16. As to how to form the upper pad 145a from the conductive layer 145, the method for forming the trace 142a mentioned above may be referred. Then, the electronic component CE may be optionally disposed on the upper pad 145a. Following that, the carrier 16 may be optionally removed to form the package device 1 of the present embodiment. The package device 1 may, for example, be formed by a redistribution layer (RDL) first process, but not limited thereto. In some embodiments, when the carrier 16 needs to be removed from the redistribution layer 14, a release film may be disposed between the carrier 16 and the redistribution layer 14 and may be treated by laser irradiation, heating, or other suitable manner to remove the carrier 16 from the redistribution layer 14, for example. In some embodiments, a plurality of package devices 1 may be formed on the carrier 16, so that a cutting process may be performed to separate the package devices 1 before or after the carrier 16 is removed, but the present disclosure is not limited to this. In some embodiments, the step of disposing the electronic component CE may be performed after the carrier 16 is removed or after the cutting process is performed. Alternatively, the step of disposing the electronic component CE may not be performed. In some embodiments, at least one conductive bump or at least one conductive ball may be optionally disposed on the lower pad 144*a* of the redistribution layer 14 to facilitate electrical connection of the lower pad 144*a* to other electronic components. The electronic component mentioned in the present disclosure may, for example, be capacitor, resistor, inductor, diode, printed circuit board (PCB), combinations thereof, or other suitable electronic components, but not limited thereto. In some embodiments, the method for forming the conductive layer 144 and the conductive layer 145 may be similar to the method for forming the conductive layer 142, but not limited thereto.

The package device and the manufacturing method thereof of the present disclosure are not limited to the above-mentioned embodiment and may include different embodiments or variant embodiments. In order to simplify the description, different embodiments and variant embodiments described below will refer to components identical to those in the first embodiment using the same labels. For clearly describing different embodiments and variant embodiments, the following contents will describe differences between the first embodiment and different embodiments or variant embodiments, and will no longer repeat descriptions regarding the same components in detail.

Figure 4:
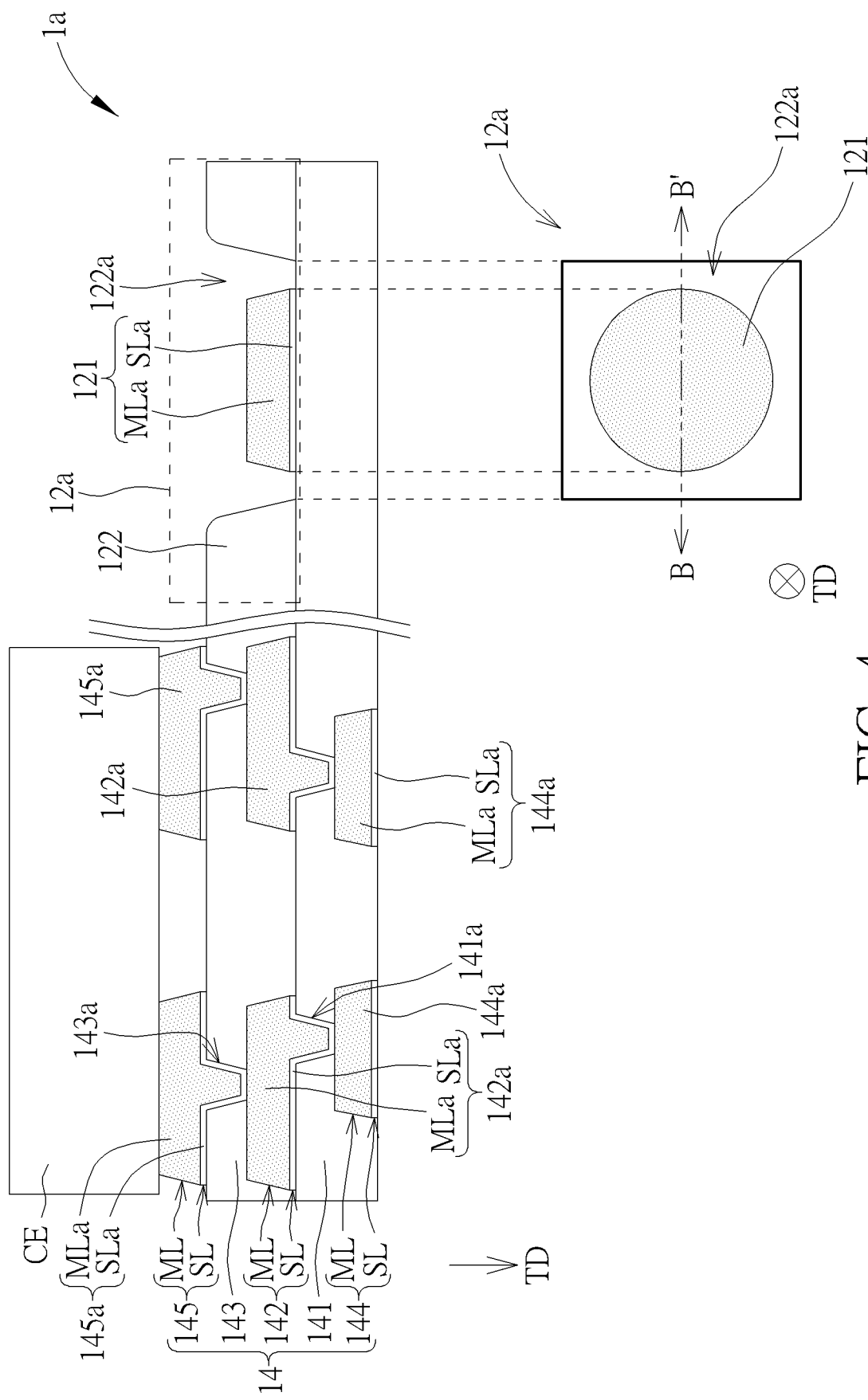
FIG. 4 schematically illustrates a package device according to another embodiment of the present disclosure.

FIG. 4 schematically illustrates a package device according to another embodiment of the present disclosure. An upper part of FIG. 4 schematically illustrates a cross-sectional view of the package device 1*a*, a lower part of FIG. 4 schematically illustrates a top view of a test pattern 12*a* of the package device 1*a*. In FIG. 4, a cross-sectional structure in right portion of the upper part is a schematic cross-sectional view taken along a line B-B' of the lower part. For clearly illustrating the package device 1*a* of the present embodiment, FIG. 4 shows the cross-sectional structure of a part of the package device 1*a*, but the present disclosure is not limited thereto. As shown in FIG. 4, in the package device 1*a*, the test pattern 12*a* may not include the second conductive pattern 123. In some embodiments, the top view shape of the first conductive pattern 121 of the test pattern 12*a* may be the same or different from the top view shape of the through hole 122*a*. For example, the top view shape of the first conductive pattern 121 may include a circle, and the top view shape of the through hole 122*a* may include a rectangle, but is not limited thereto. The top view shape of the first conductive pattern 121 and the top view shape of the through hole 122*a* may be adjusted according to the requirements. The second conductive pattern 123 may not be formed in the step of forming the conductive layer 142 in the manufacturing method of the package device 1*a*. Other parts of the package device 1*a* and other steps of the manufacturing method of the package device 1*a* may be similar to the above-mentioned embodiments, and will not be detailed redundantly.

Figure 5:
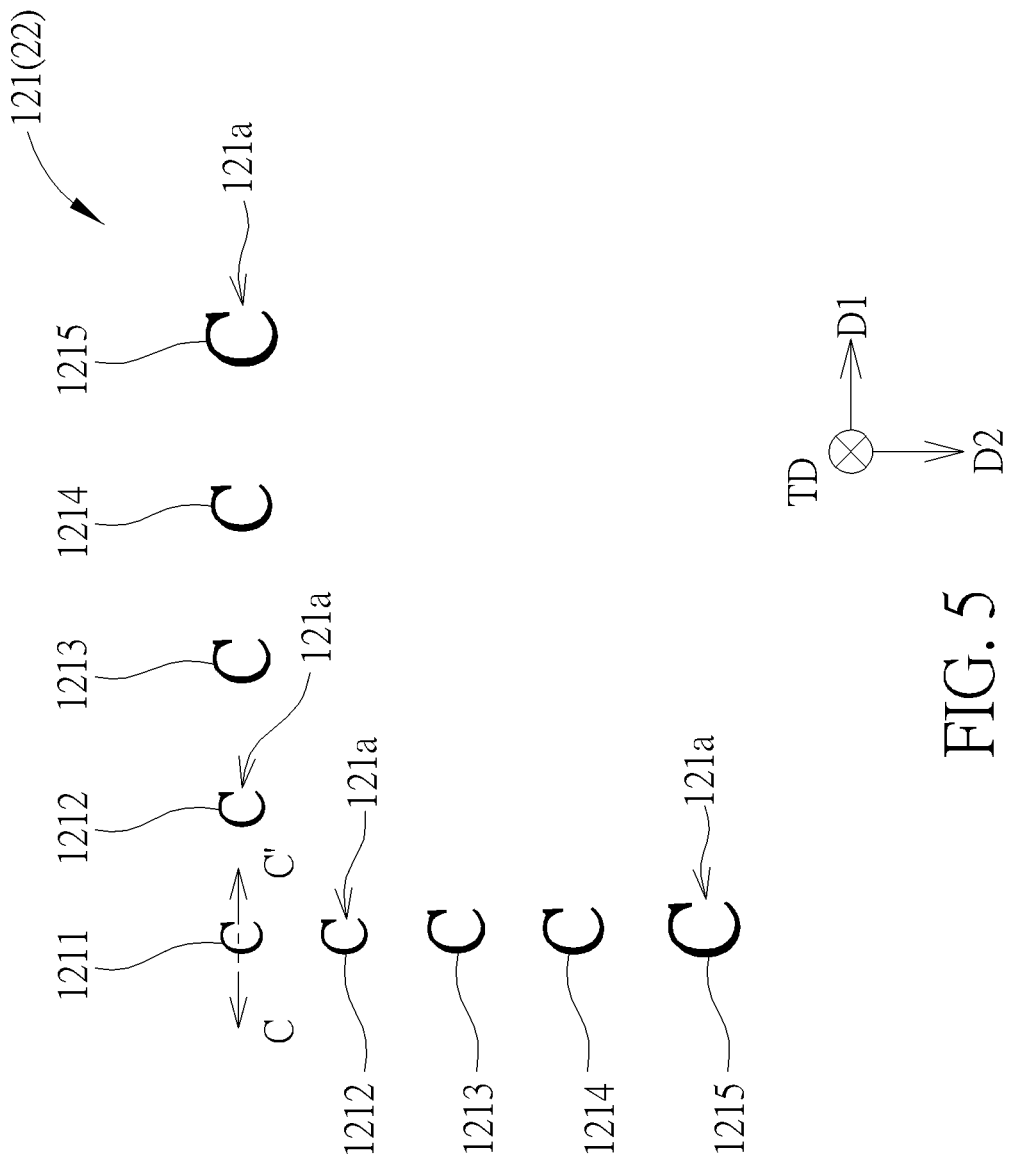
FIG. 5 schematically illustrates a top view of a test pattern according to another embodiment of the present disclosure.
Figure 6:
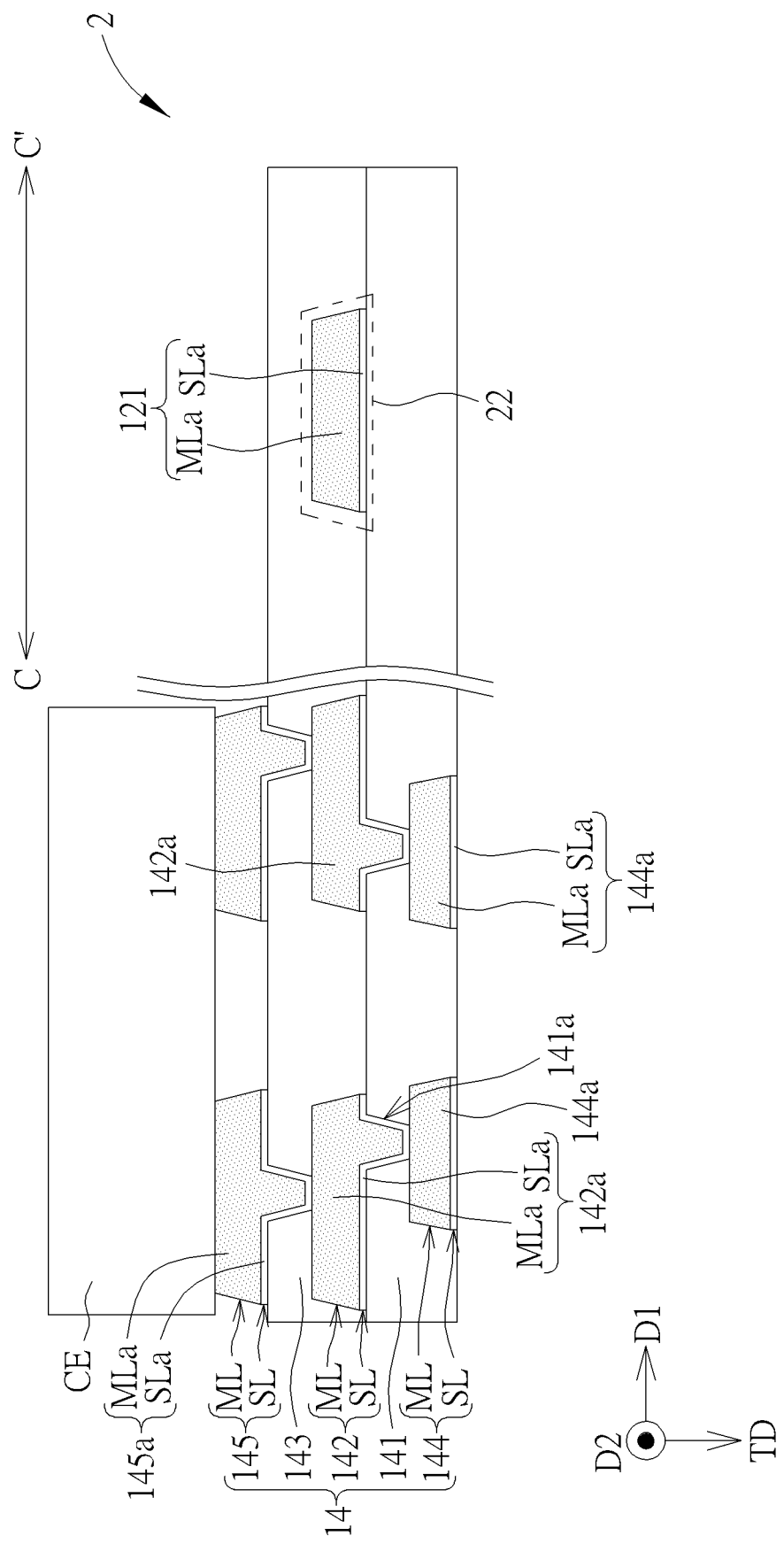
FIG. 6 schematically illustrates a cross-sectional view of a package device according to another embodiment of the present disclosure.

FIG. 5 schematically illustrates a top view of a test pattern according to another embodiment of the present disclosure, and FIG. 6 schematically illustrates a cross-sectional view of a package device according to another embodiment of the present disclosure. A right part of FIG. 6 schematically illustrates the cross-sectional view taken along a line C-C' of FIG. 5. As shown in FIG. 5 and FIG. 6, in the package device 2, the first conductive pattern 121 of the test pattern 22 includes a plurality of sub-portions (for example, a sub-portion 1211, a sub-portion 1212, a sub-portion 1213, a sub-portion 1214, and/or a sub-portion 1215), and the plurality of sub-portions may have similar top view shapes, but not limited thereto. In some embodiments, the sub-portions (for example, the sub-portion 1211, the sub-portion 1212, the sub-portion 1213, the sub-portion 1214, and/or the sub-portion 1215) may be arranged along at least one direction or arranged along plural directions, for example, arranged along a direction D1 and/or a direction D2. The direction D1 is different from the direction D2, and for instance, the direction D1 is perpendicular to the direction D2, but is not limited thereto. In some embodiments, sizes of the plurality of sub-portions (such as the sub-portion 1211, the sub-portion 1212, the sub-portion 1213, the sub-portion 1214, and the sub-portion 1215) may sequentially increase or decrease along the at least one direction. It should be noted that the above-mentioned sequential increase or decrease does not mean that the sizes need to be changed proportionally. In the embodiment shown in FIG. 5, each of the sub-portions (for example, the sub-portion 1211, the sub-portion 1212, the sub-portion 1213, the sub-portion 1214, and/or the sub-portion 1215) may respectively include a notch 121*a*. Since the sizes of the sub-portions sequentially increase along the direction D1, the direction D2, and/or other directions, widths of the notches 121*a* may sequentially increase along the direction D1, the direction D2, and/or other directions, but the present disclosure is not limited thereto. The quality of the patterning process performed on different regions of the conductive layer 142 (as shown in FIG. 6) may be judged by inspecting the widths of the notches 121*a*. In some embodiments, the top view shapes of the sub-portions may be C-shape, E-shape or other suitable shapes with notches. By means of inspecting the sub-portions arranged along different directions and having different widths of the notches 121*a*, the formation qualities in different directions or regions of the conductive layer 142 (as shown in FIG. 6) may be determined.

It should be noted that, as shown in FIG. 6, the test pattern 22 may be formed of the first conductive pattern 121 (including a plurality of sub-portions) and does not include the second dielectric layer 143. In such case, the step of inspecting the conductive layer 142 may be performed before the second dielectric layer 143 is formed, but not limited thereto. The second dielectric layer 143 of the present embodiment may be disposed on the first conductive pattern 121 and does not have the through hole 122*a*. Therefore, the step of forming the second dielectric layer 143 may not include forming the through hole 122*a*, but not limited thereto. The manufacturing method of other parts of the package device 2 may be similar to the above-mentioned embodiments, and will not be detailed redundantly.

Figure 7:
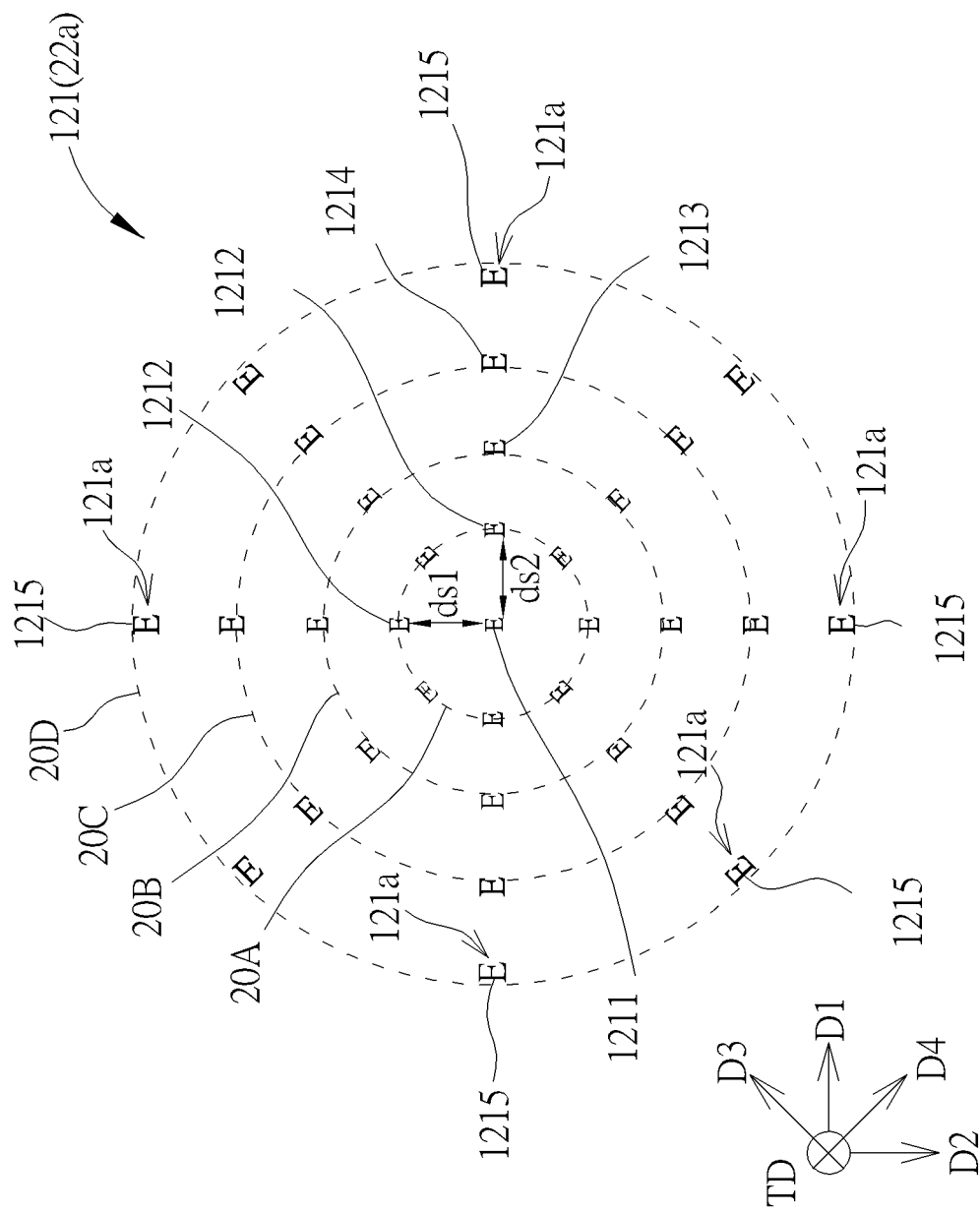
FIG. 7 schematically illustrates a top view of a test pattern according to another embodiment of the present disclosure.

FIG. 7 schematically illustrates a top view of a test pattern according to another embodiment of the present disclosure. As shown in FIG. 7, the first conductive pattern 121 of the test pattern 22*a* may include a plurality of sub-portions (for example, the sub-portion 1211, the sub-portion 1212, the sub-portion 1213, the sub-portion 1214, and/or the sub-portion 1215), and the sub-portions may be arranged radially, but not limited to thereto. A top view shape of at least one of the sub-portions of the first conductive pattern 121 may have a notch. In the embodiment of FIG. 7, the top view shapes of the sub-portions of the first conductive pattern 121 are E-shaped as an example, but not limited thereto. The top view shapes of the sub-portions may be other suitable shapes. In detail, the first conductive pattern 121 of the test pattern 22a may include a plurality of sub-portions 1211, a plurality of sub-portions 1212, a plurality of sub-portions 1213, a plurality of sub-portions 1214, and/or a plurality of sub-portions 1215 sequentially arranged from a center of the test pattern 22a to a periphery of the test pattern 22a, and a size of the sub-portion 1211, a size of the sub-portion 1212, a size of the sub-portion 1213, a size of the sub-portion 1214, and a size of the sub-portion 1215 may be sequentially from small to large, but not limited thereto. For example, the sub-portion 1211 may be substantially located at a center of the test pattern 22a (or the first conductive pattern 121), and the sub-portion 1211, one of the sub-portions 1212, one of the sub-portions 1213, one of the sub-portions 1214, and one of the sub-portions 1215 may be arranged along the direction D1 in sequence. The sub-portion 1211, another one of the sub-portions 1212, another one of the sub-portions 1213, another one of the sub-portions 1214, and another one of the sub-portions 1215 may be arranged along the direction D2 in sequence, and so on. The sub-portion 1211, the other sub-portions 1212, the other sub-portions 1213, the other sub-portions 1214, and the other sub-portions 1215 may be arranged along the direction D3, the direction D4 or other directions in sequence. The direction D1, the direction D2, the direction D3, and the direction D4 may be not the same or not parallel to each other. In some embodiments, the size of the sub-portion 1211, the size of the sub-portion 1212, the size of the sub-portion 1213, the size of the sub-portion 1214, and the size of the sub-portion 1215 may be sequentially from large to small, and the present disclosure is not limited herein.

In some embodiments, the sub-portions having substantially the same size may be located on a circle (such as a dotted circle 20A, a dotted circle 20B, a dotted circle 20C, or a dotted circle 20D shown in FIG. 7) centered on the sub-portion 1211. For example, the sub-portions 1212 having substantially the same size may be located substantially on the dotted circle 20A, and the shortest distances (such as a distance ds1 or a distance ds2) between the sub-portions 1212 and the sub-portion 1211 may be designed to be substantially the same as each other. Similarly, other sub-portions 1213, other sub-portions 1214 and other sub-portions 1215 may be respectively located on other dotted circles (20B, 20C and 20D) centered on the sub-portion 1211. It should be noted that the notches 121a of the sub-portions located on the same dotted circle (20A, 20B, 20C and 20D) may face toward the same direction or different directions. With this design, the formation quality in different directions or regions of other conductive components (such as traces) formed of the same layer as the test pattern 22a (or the first conductive pattern 121) may be inspected.

Figure 8:
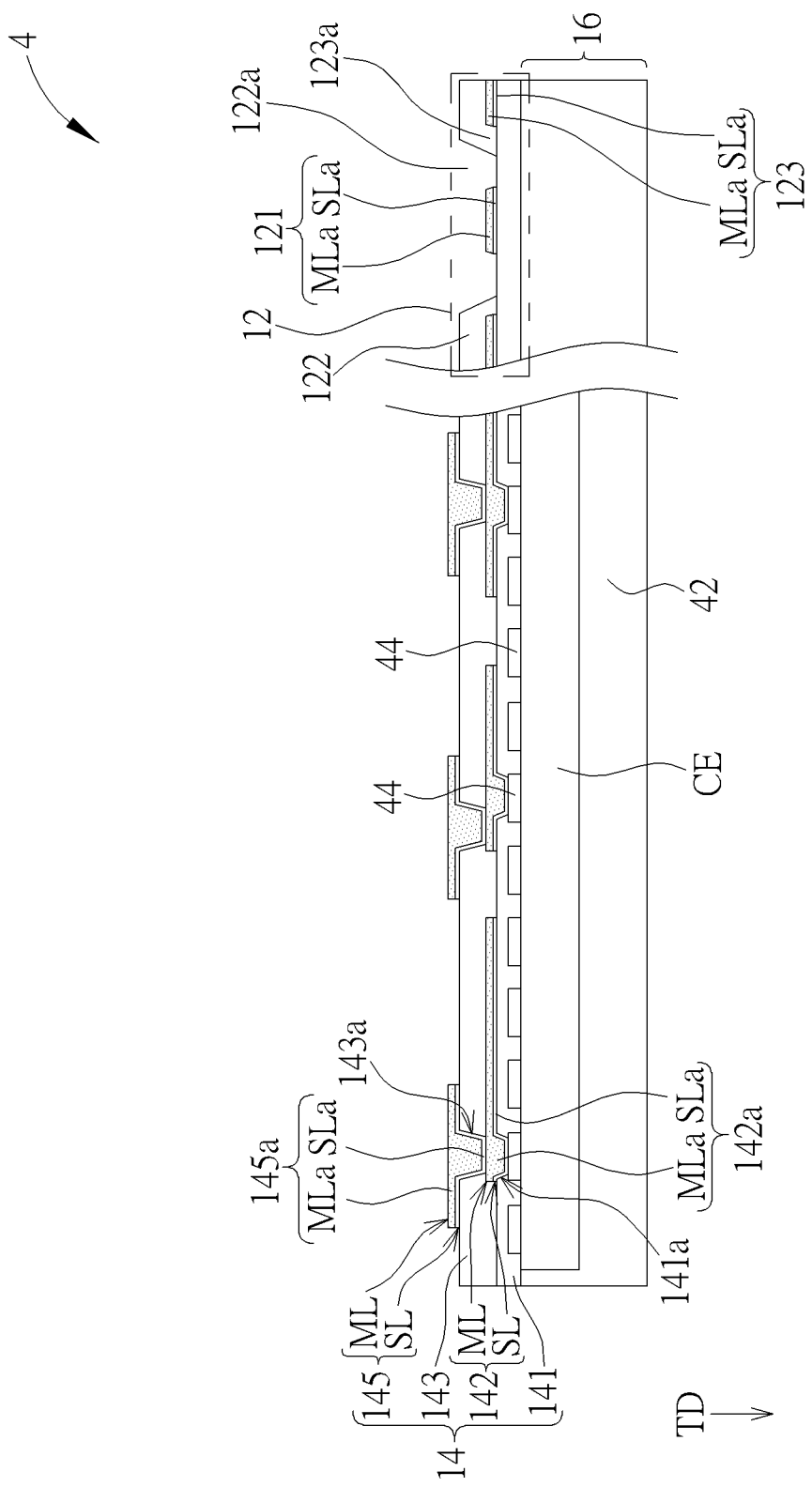
FIG. 8 schematically illustrates a cross-sectional view of a package device according to another embodiment of the present disclosure.

FIG. 8 schematically illustrates a cross-sectional view of a package device according to another embodiment of the present disclosure. As shown in FIG. 8, in the package device 4, the redistribution layer 14 may be disposed on the carrier 16, and the carrier 16 may be included in the package device 4. In other words, in the manufacturing method of the package device 4, the redistribution layer 14 may be formed on the carrier 16, and the carrier 16 does not need to be removed after the redistribution layer 14 is formed. The package device 4 may, for example, be formed by a chip first process, but not limited thereto. The carrier 16 may include, for example, a wafer, an electronic component CE, an electronic component CE surrounded by an encapsulation structure, or other components suitable for supporting the redistribution layer 14 and without being removed from the redistribution layer 14. The electronic component CE may include, for example, a chip, but not limited thereto. In the embodiment of FIG. 8, the carrier 16 may include an electronic component CE and an encapsulation structure 42, wherein the redistribution layer 14 may be disposed on the electronic component CE, and the encapsulation structure 42 at least surrounds sides of the electronic component CE, but not limited thereto. In some embodiments, the encapsulation structure 42 may be disposed on a surface of the electronic component CE opposite to the redistribution layer 14, or a surface of the electronic component CE opposite to the redistribution layer 14 may be exposed to facilitate heat dissipation. Further, the electronic component CE may include a plurality of pads 44, and the redistribution layer 14 may, for example, be electrically connected to the corresponding pads 44, but not limited to this. The redistribution layer 14 in the embodiment of FIG. 8 is different from the redistribution layer 14 of FIG. 1 in that the redistribution layer 14 may not include the lower pad, and the redistribution layer 14 may be directly formed on the pads 44 of the electronic component CE, so that the traces 142a of the conductive layer 142 may be electrically connected to the pads 44, but the present disclosure is not limited to this. In some embodiments, the redistribution layer 14 may also adopt the redistribution layer of any of the above embodiments, for example, and the lower pads of the redistribution layer 14 are disposed on the corresponding pads of the electronic component CE. Since other parts of the redistribution layer 14 may be the same as the redistribution layer 14 shown in FIG. 1, FIG. 4, or FIG. 6, they will not be described in detail herein. In addition, the test pattern 12 may be disposed on the carrier 16, and the test pattern 12 may adopt any one of the test patterns of FIG. 1 and FIG. 4 to FIG. 7, so they will not be described in detail herein.

In the manufacturing method of the embodiment of FIG. 8, the electronic component CE may be disposed on another carrier (not shown) by a chip first process in a manner of a surface of the electronic component CE with the pads 44 facing down, and an encapsulation process is performed to form the encapsulation structure 42 on the electronic component CE. Then, the another carrier may be removed, and the electronic component CE and the encapsulation structure 42 are turned upside down, so that the surface of the electronic component CE with the pads 44 faces upward. Then, the redistribution layer 14 may be formed on the electronic component CE and the encapsulation structure 42. The method of forming the redistribution layer 14 may, for example, be the same as or similar to the method of forming the redistribution layer in any one of the above embodiments and will not be redundantly described herein. After the redistribution layer 14 is completed or other subsequent processes are completed, a cutting process may be performed on the redistribution layer 14 to form the package device including the electronic component CE. In some embodiments, conductive bumps or conductive balls may be optionally disposed on the upper pads 145a of the redistribution layer 14 to facilitate electrical connection of the upper pads 145a to other electronic components.

Figure 9:
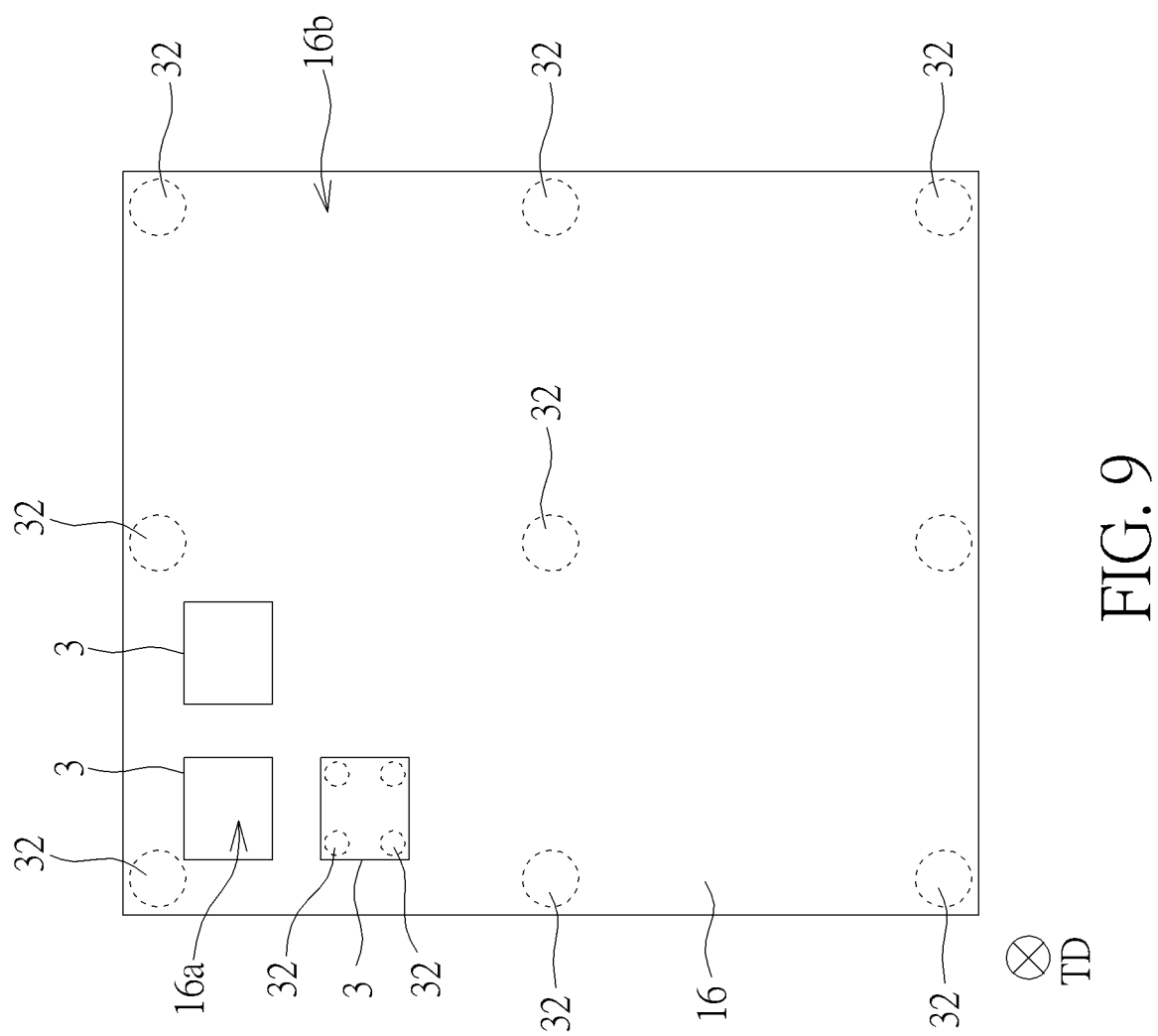
FIG. 9 schematically illustrates a top view of the positions of the test patterns according to another embodiment of the present disclosure.

FIG. 9 schematically illustrates a top view of positions of test patterns according to another embodiment of the present disclosure. As shown in FIG. 9, the provided carrier 16 may have a plurality of device regions 16a and a peripheral region 16b surrounding the device regions 16a, but not limited herein. A package device 3 may be formed on one of the device regions 16a. A redistribution layer 14 (not shown, refer to FIG. 1 to FIG. 4 or FIG. 8) is formed on the carrier 16. The redistribution layer 14 may include at least one the test patterns 32. At least one of the test patterns 32 is disposed on at least one of the device regions 16a and/or the peripheral region 16b. For example, the package device 3 may include the package device of any one of the above embodiments, and the test patterns 32 may include the test pattern of any one of the above embodiments. In FIG. 9, when one of the test patterns 32 is formed in the peripheral region 16b of the carrier 16, this test pattern 32 may be located adjacent to a corner and/or side of the carrier 16. In some embodiments, the test pattern 32 may be on a center of the carrier 16 and/or on other area of the peripheral region 16b, but not limited thereto. In some embodiments, when one of the test patterns 32 is formed in the package device 3, this test pattern 32 may be located adjacent to a corner, a side, and/or other area of the package device 3, but is not limited thereto.

In some embodiments, after a plurality of package devices 3 are formed, after corresponding parts of the redistribution layer 14 are formed in the device regions 16a, the peripheral region 16b may be removed, and the test patterns 32 formed in the peripheral region 16b of the carrier 16 may also be removed for instance.

Figure 10:
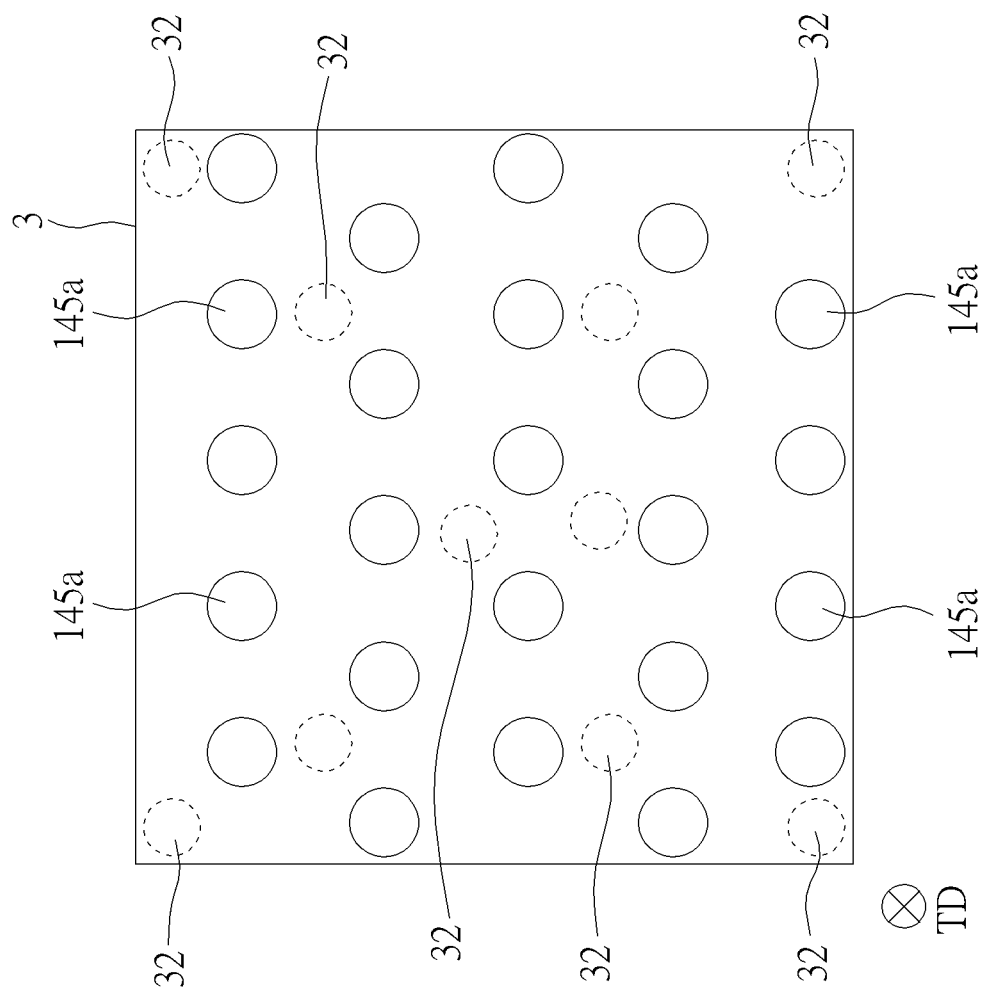
FIG. 10 schematically illustrates a top view of the positions of the test patterns located in a package device according to another embodiment of the present disclosure.

FIG. 10 schematically illustrates a top view of positions of test patterns located in a package device according to another embodiment of the present disclosure. As shown in FIG. 10, the test patterns 32 may be dispersed in different positions of the package device 3. For example, the test patterns 32 may be located between two adjacent ones of the plurality of upper pads 145a and/or disposed at the corners of the package device 3. In some embodiments, the size of one of the test patterns 32 may be smaller than the size of one of the plurality of upper pads 145a, for example, but is not limited herein. In other embodiments, the relationship between the size of one of the test patterns 32 and the size of one of the upper pads 145a may be designed according to requirements. The test patterns 32 may include a combination of at least one or at least two of the test patterns in the above embodiments, but is not limited thereto.

In summary, in the manufacturing method of the package device of the present disclosure, since the test pattern is simultaneously formed in the process of manufacturing the package device, the quality of the patterning process and/or alignment accuracy may be inspected in real time by identifying the test pattern, thereby improving the yield rate of the process.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A package device, comprising:
a redistribution layer comprising a first dielectric layer, a conductive layer and a second dielectric layer, and the conductive layer disposed between the first dielectric layer and the second dielectric layer, wherein the redistribution layer has a test pattern, the test pattern comprises a first conductive pattern, and the first conductive pattern is formed of the conductive layer, wherein the test pattern further comprises a dielectric pattern corresponding to the first conductive pattern and a second conductive pattern adjacent to the first conductive pattern, the dielectric pattern is formed of the second dielectric layer, the second conductive pattern is formed of the conductive layer, the second conductive pattern has an opening, and the first conductive pattern is disposed in the opening in a top view direction of the package device.

2. The package device according to claim 1, wherein the dielectric pattern has a through hole exposing the first conductive pattern.

3. The package device according to claim 2, wherein a top view shape of the first conductive pattern corresponds to a top view shape of the through hole.

4. The package device according to claim 1, wherein the dielectric pattern has a through hole exposing the first conductive pattern, and the through hole is disposed in the opening in the top view direction of the package device.

5. The package device according to claim 1, wherein the redistribution layer further comprises a trace, the trace is formed of the conductive layer, the trace is electrically connected to an electronic component disposed on the redistribution layer, and the trace is electrically insulated from the test pattern.

6. The package device according to claim 1, wherein the conductive layer is a multilayered structure, and the multilayered structure comprises a seed layer and a metal layer stacked sequentially.

7. The package device according to claim 1, wherein a thickness of the conductive layer ranges from 4 µm to 5 µm.

8. The package device according to claim 1, wherein a thickness of the second dielectric layer ranges from 4 µm to 7 µm.

9. The package device according to claim 1, wherein the conductive layer comprises a metal material.

10. The package device according to claim 1, further comprising a plurality of upper pads disposed on the second dielectric layer, and a size of the test pattern is smaller than a size of one of the plurality of upper pads.

11. The package device according to claim 10, wherein the test pattern is located between two adjacent ones of the plurality of upper pads.

12. A manufacturing method of a package device, comprising:
providing a carrier; and
forming a redistribution layer on the carrier,
wherein the redistribution layer comprises a first dielectric layer, a conductive layer and a second dielectric layer, and the conductive layer is disposed between the first dielectric layer and the second dielectric layer,
wherein the redistribution layer has a test pattern, the test pattern comprises a first conductive pattern, and the first conductive pattern is formed of the conductive layer,
wherein the test pattern further comprises a dielectric pattern corresponding to the first conductive pattern and a second conductive pattern adjacent to the first conductive pattern, the dielectric pattern is formed of the second dielectric layer, the second conductive pattern is formed of the conductive layer, the second conductive pattern has an opening, and the first conductive pattern is disposed in the opening in a top view direction of the package device.

13. The manufacturing method of the package device according to claim 12, wherein the carrier comprises a plurality of device regions and a peripheral region surrounding the plurality of device regions, and the test pattern is disposed on at least one of the peripheral region and the plurality of device regions.

14. The manufacturing method of the package device according to claim 12, wherein forming the redistribution layer comprises:
forming the first dielectric layer on the carrier;

forming the conductive layer on the first dielectric layer; and forming the second dielectric layer on the conductive layer.

* * * * *